United States Patent
Kim et al.

(10) Patent No.: US 9,390,841 B2
(45) Date of Patent: Jul. 12, 2016

(54) VAPOR DEPOSITION APPARATUS, METHOD OF FORMING THIN FILM USING THE SAME AND METHOD OF MANUFACTURING ORGANIC LIGHT-EMITTING DISPLAY APPARATUS

(71) Applicants: Jin-Kwang Kim, Yongin (KR);
Seung-Yong Song, Yongin (KR);
Myung-Soo Huh, Yongin (KR);
Suk-Won Jung, Yongin (KR);
Choel-Min Jang, Yongin (KR);
Jae-Hyun Kim, Yongin (KR);
Sung-Chul Kim, Yongin (KR)

(72) Inventors: Jin-Kwang Kim, Yongin (KR);
Seung-Yong Song, Yongin (KR);
Myung-Soo Huh, Yongin (KR);
Suk-Won Jung, Yongin (KR);
Choel-Min Jang, Yongin (KR);
Jae-Hyun Kim, Yongin (KR);
Sung-Chul Kim, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 214 days.

(21) Appl. No.: 13/795,399

(22) Filed: Mar. 12, 2013

(65) Prior Publication Data
US 2014/0141154 A1    May 22, 2014

(30) Foreign Application Priority Data
Nov. 19, 2012  (KR) .................. 10-2012-0131114

(51) Int. Cl.
*C23C 16/00*    (2006.01)
*H01B 13/30*    (2006.01)
*C23C 14/24*    (2006.01)
*C23C 14/56*    (2006.01)
*C23C 16/44*    (2006.01)
*C23C 16/455*    (2006.01)

(52) U.S. Cl.
CPC ............... *H01B 13/30* (2013.01); *C23C 14/24* (2013.01); *C23C 14/564* (2013.01); *C23C 16/4401* (2013.01); *C23C 16/45536* (2013.01); *C23C 16/45551* (2013.01)

(58) Field of Classification Search
CPC   C23C 14/564; C23C 14/24; C23C 16/45551; C23C 16/4401; C23C 16/45536
USPC ............... 427/255.23, 255.5, 248.1
See application file for complete search history.

(56) References Cited

U.S. PATENT DOCUMENTS

2004/0159285 A1*  8/2004  Doehler et al. ............... 118/718
2005/0016956 A1   1/2005  Liu et al.
(Continued)

FOREIGN PATENT DOCUMENTS

JP    2005-116898 A    4/2005
KR    10-2000-0000606 A    1/2000
(Continued)

OTHER PUBLICATIONS
Poodt et al. Spatial atomic layer deposition: A route towards further industrialization of atomic layer deposition, J. Vac. Sci. Technol. A 30(1), Jan./Feb. 2012, pp. 010802-1-11.*
(Continued)

*Primary Examiner* — Kelly M Gambetta
(74) *Attorney, Agent, or Firm* — Lee & Morse, P.C.

(57) ABSTRACT

A vapor deposition apparatus in which a deposition process is performed by moving a substrate, the vapor deposition apparatus including a supply unit that injects at least one raw material gas towards the substrate, and a blocking gas flow generation unit that is disposed corresponding to the supply unit and generates a gas-flow that blocks a flow of the raw material gas.

7 Claims, 6 Drawing Sheets

(56) References Cited

U.S. PATENT DOCUMENTS

| | | | |
|---|---|---|---|
| 2007/0224348 A1* | 9/2007 | Dickey et al. | 427/248.1 |
| 2009/0081356 A1* | 3/2009 | Fedorovskaya et al. | 427/66 |
| 2010/0068413 A1 | 3/2010 | Lee | |
| 2010/0151150 A1 | 6/2010 | Kokaze et al. | |
| 2011/0042697 A1 | 2/2011 | Lee et al. | |
| 2012/0094149 A1 | 4/2012 | Lee et al. | |
| 2013/0260488 A1* | 10/2013 | Kim et al. | 438/26 |

FOREIGN PATENT DOCUMENTS

| | | |
|---|---|---|
| KR | 10 2005-0114234 A | 12/2005 |
| KR | 10 2010-0002267 A | 1/2010 |
| KR | 10 2010-0032315 A | 3/2010 |
| KR | 10-1094298 B1 | 2/2011 |
| KR | 10 2011-0072146 A | 6/2011 |
| KR | 10-2012-0069590 A | 10/2013 |
| WO | WO 2012/054323 A1 | 4/2012 |

OTHER PUBLICATIONS

Korean Office Action Dated Dec. 20, 2013.

* cited by examiner

VAPOR DEPOSITION APPARATUS, METHOD OF FORMING THIN FILM USING THE SAME AND METHOD OF MANUFACTURING ORGANIC LIGHT-EMITTING DISPLAY APPARATUS

CROSS-REFERENCE TO RELATED PATENT APPLICATION

This application claims priority to and the benefit of Korean Patent Application No. 10-2012-0131114, filed on Nov. 19, 2012, in the Korean Intellectual Property Office, the entire disclosure of which is incorporated by reference herein.

BACKGROUND

1. Field

Embodiments relate to a vapor deposition apparatus, a method of forming a thin film using the same, and a method of manufacturing an organic light-emitting display apparatus.

2. Description of the Related Art

Semiconductor devices, display devices, and other electronic devices may include a plurality of thin films. Various methods may be used to form the plurality of thin films.

SUMMARY

Embodiments are directed to a vapor deposition apparatus in which a deposition process is performed by moving a substrate, the vapor deposition apparatus including a supply unit that injects at least one raw material gas towards the substrate; and a blocking gas flow generation unit that is disposed corresponding to the supply unit and generates a gas-flow that blocks a flow of the raw material gas.

The vapor deposition apparatus may further include a chamber to accommodate the substrate, the supply unit, and the blocking gas flow generation unit therein.

The blocking gas flow generation unit may inject towards the supply unit a blocking gas that contains an inert gas.

The blocking gas flow generation unit may inject towards the supply unit the blocking gas that contains an inert gas when the substrate is not located in a region corresponding to the supply unit.

The blocking gas flow generation unit may include a plurality of slits to inject the blocking gas.

The vapor deposition apparatus may further include a driving unit to move the substrate.

The substrate may be placed on a stage and the driving unit may be connected to the stage to move the stage.

The driving unit may be disposed to have a reciprocal movement along guide rails.

The driving unit may include a first supporting member, a second supporting member, and a separation space that is defined as a space between the first supporting member and the second supporting member.

The first supporting member and the second supporting member may be disposed to reciprocally move along guide rails.

The blocking gas flow generation unit may be disposed to correspond to the separation space while the driving unit is moving.

The supply unit may inject the raw material gas towards ground.

The supply unit may include a first injection unit that injects a first raw material gas, a second injection unit that injects a second raw material gas, and an exhaust unit.

The first injection unit may inject the first raw material gas in a radical type form to the substrate by generating plasma at a same time as when the first raw material gas is injected.

Embodiments are also directed to a method of forming a thin film on a substrate using a vapor deposition apparatus, the method including performing a deposition process on the substrate, the deposition process including injecting at least one raw material gas towards the substrate while moving the substrate relative to a supply unit that injects the at least one raw material gas; and blocking a flow of the raw material gas using a gas flow generated by a blocking gas flow generation unit that is disposed corresponding to the supply unit.

The blocking gas may contain an inert gas, and the blocking gas flow generation unit may inject the blocking gas towards the supply unit when the substrate is not located in a region corresponding to the supply unit.

Embodiments are also directed to a method of manufacturing an organic light-emitting display apparatus that includes a thin film formed on a substrate, the method including performing a deposition process on the substrate using a vapor deposition apparatus, the deposition process including injecting at least one raw material gas towards the substrate while moving the substrate relative to a supply unit that injects the at least one raw material gas; and blocking a flow of the raw material gas using a gas flow generated by a blocking gas flow generation unit that is disposed corresponding to the supply unit.

The organic light-emitting display apparatus may include a first electrode, an intermediate layer that includes an organic light-emitting layer, a second electrode, and an encapsulating layer, and the deposition process may form the encapsulating layer.

The deposition process may form an insulating layer.

The deposition process may form a conductive film.

BRIEF DESCRIPTION OF THE DRAWINGS

Features will become apparent to those of skill in the art by describing in detail example embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "on" another element, it can be directly on the other element, or one or more intervening elements may also be present. It will also be understood that when an element is referred to as being "under" another element, it can be directly under, or one or more intervening elements may also be present. It will also be understood that when an element is referred to as being "between" two elements, it can be the only element between the two elements, or one or more intervening elements may also be present. Like reference numerals refer to like elements throughout.

Figure 1:
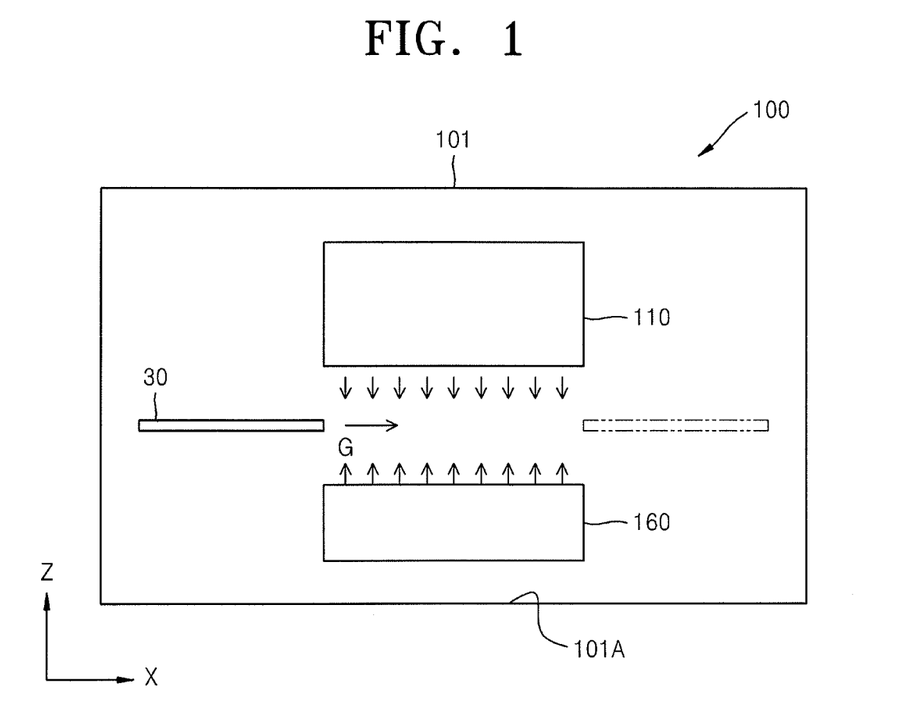
FIG. 1 is schematic drawing of a vapor deposition apparatus according to an embodiment.
Figure 2A:
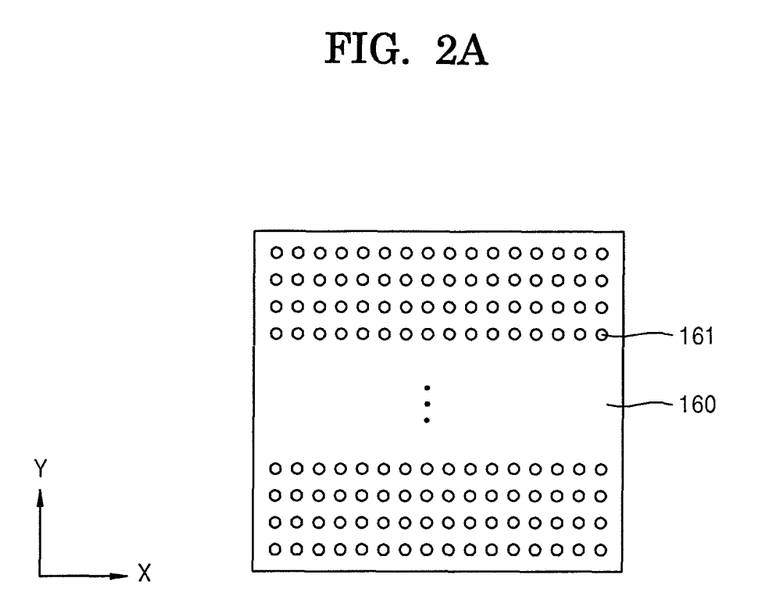
FIG. 2A is a plan view of an upper surface of a blocking gas flow generation unit of FIG. 1, according to an embodiment.
Figure 2B:
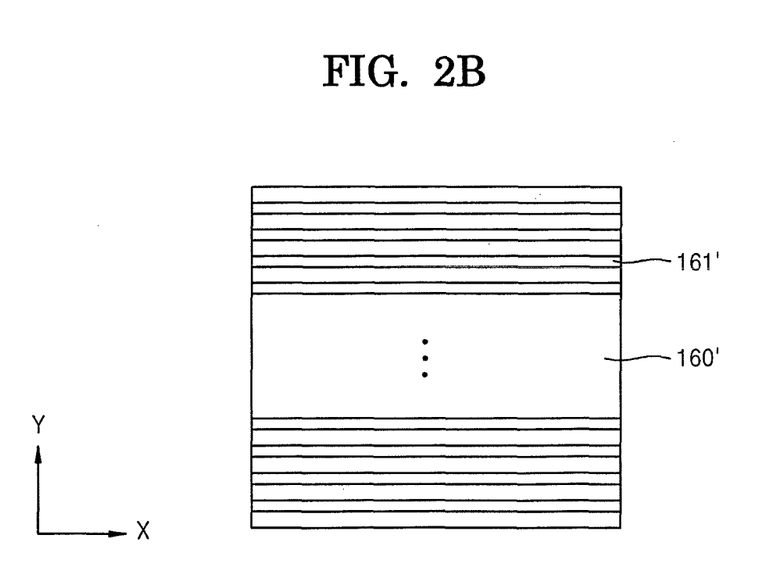
FIG. 2B is a plan view of an upper surface of a blocking gas flow generation unit of FIG. 1, according to another embodiment.

FIG. 1 is schematic drawing of a vapor deposition apparatus 100 according to an embodiment. FIG. 2A is a plan view of an upper surface of a blocking gas flow generation unit 160 of FIG. 1, according to an embodiment. FIG. 2B is a plan view of an upper surface of a blocking gas flow generation unit 160' of FIG. 1, according to another embodiment.

In the example embodiment shown in FIGS. 1, 2A, and 2B, the vapor deposition apparatus 100 includes a chamber 101, a supply unit 110, and the blocking gas flow generation unit 160.

The chamber 101 may be connected to a pump (not shown) to control an ambient or atmospheric pressure during a deposition process, and may accommodate all of a substrate 30, the supply unit 110, and the blocking gas flow generation unit 160 to protect them. Although not shown, the chamber 101 may include at least one doorway through which the substrate 30 may move in and out.

The supply unit 110 supplies at least one gas so that a deposition process with respect to the substrate 30 may be performed.

The substrate 30 is disposed to be able to move in a direction indicated by an arrow, that is, to have a left-right reciprocal movement, as indicated in FIG. 1. That is, the substrate 30 is moved by a driving unit (not shown in FIG. 1) so that a deposition process may be continuously performed. In particular, a deposition process, in which one cycle includes processes being performed a number of times, may be readily performed by one cycle of a deposition process by continuously moving the substrate 30.

The substrate 30 is disposed below the supply unit 110, and thus, the supply unit 110 injects at least one gas towards the substrate 30, e.g., in a direction towards ground.

The blocking gas flow generation unit 160 is disposed corresponding to the supply unit 110 to inject a blocking gas G upwards. The blocking gas flow generation unit 160 includes a plurality of slits 161 to inject the blocking gas G. Thus, as depicted in FIG. 2A, the blocking gas flow generation unit 160 may include a plurality of slits 161. The slits may be substantially linear, curved, having a shape similar to a circle, etc. As depicted in FIG. 2B, the blocking gas flow generation unit 160' according to another embodiment may include a plurality of linear type slits 161'.

The blocking gas flow generation unit 160 is disposed to correspond to the supply unit 110 to inject the blocking gas G in a counter direction to the direction of the raw material gas injected from the supply unit 110. The blocking gas G may include an inert gas so that the blocking gas G does not react with the raw material gas and to prevent any adverse affect on the deposition process.

The blocking gas flow generation unit 160 prevents the raw material gas injected from the supply unit 110 from spreading by injecting the blocking gas G in a direction towards the supply unit 110. In particular, the blocking gas G prevents the raw material gas injected from the supply unit 110 from contaminating a bottom surface 101A of the chamber 101.

In the vapor deposition apparatus 100 according to the current embodiment, a deposition process may be performed by continuously moving the substrate 30, and thus, an efficiency of the deposition process may be increased.

While the substrate 30 is positioned at a location corresponding to the supply unit 110, one or more gases may be simultaneously or sequentially injected to the substrate 30 from the supply unit 110. Generally, if a substrate is outside of a region where a supply unit injects raw material gas, the raw material gas injected from the supply unit is not blocked by the substrate but is instead spread in the chamber, such that the raw material gas may reach the bottom surface of the chamber and contaminate the bottom surface. However, according to the current embodiment, the blocking gas flow generation unit 160 is disposed to correspond to the supply unit 110, and the blocking gas G is injected from the blocking gas flow generation unit 160 towards the supply unit 110. The blocking gas G may form a blocking gas flow, and thus, may act as a barrier when the raw material gas is injected from the supply unit 110. Therefore, the movement of the raw material gas towards the bottom surface 101A of the chamber 101 is reduced or prevented. Thus, in the course of a continuous deposition process while the substrate 30 is moving, the contamination of the bottom surface 101A of the chamber 101 by the raw material gas may be reduced or prevented.

The blocking gas flow generation unit 160 may inject the blocking gas G in various ways, for example, may continuously inject the blocking gas G towards the supply unit 110 or optionally, may inject the blocking gas G when the substrate 30 is outside of the region corresponding to the supply unit 110.

Figure 3:
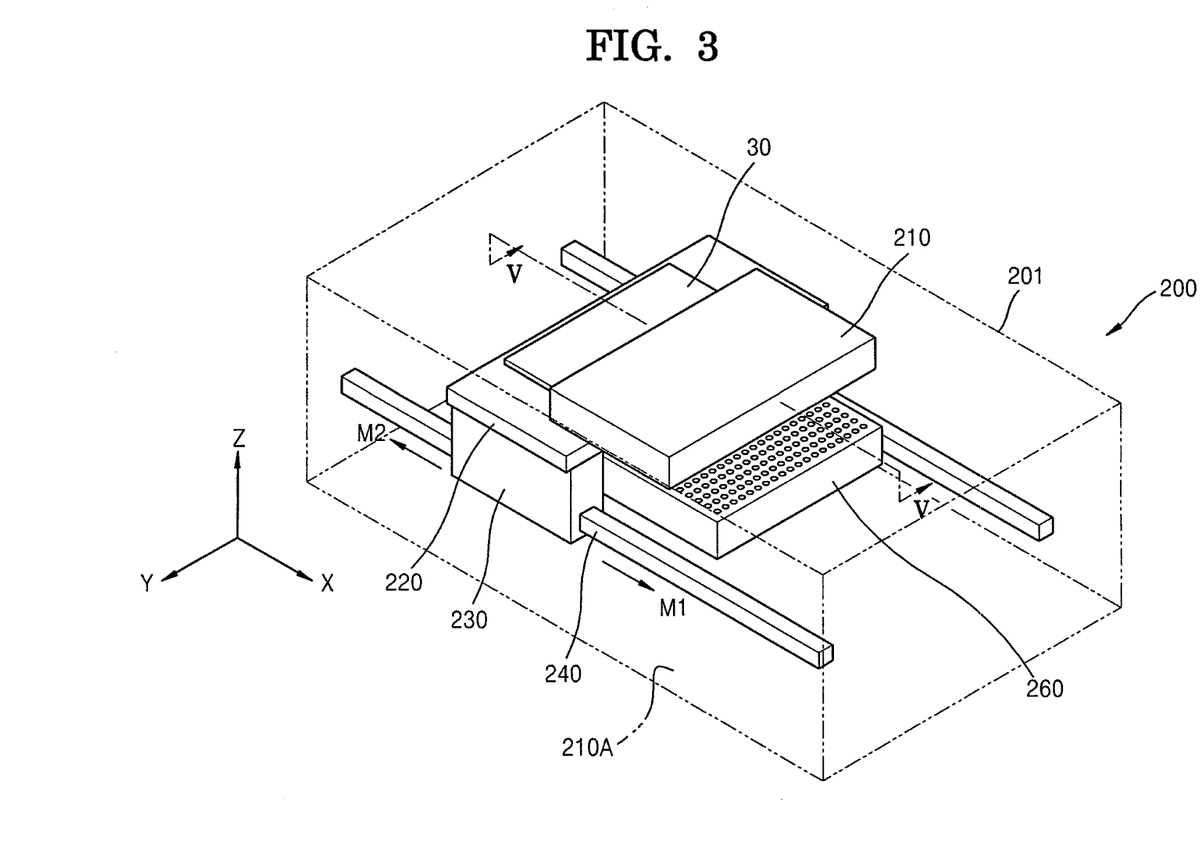
FIG. 3 is a schematic perspective view of a vapor deposition apparatus according to another embodiment.
Figure 4:
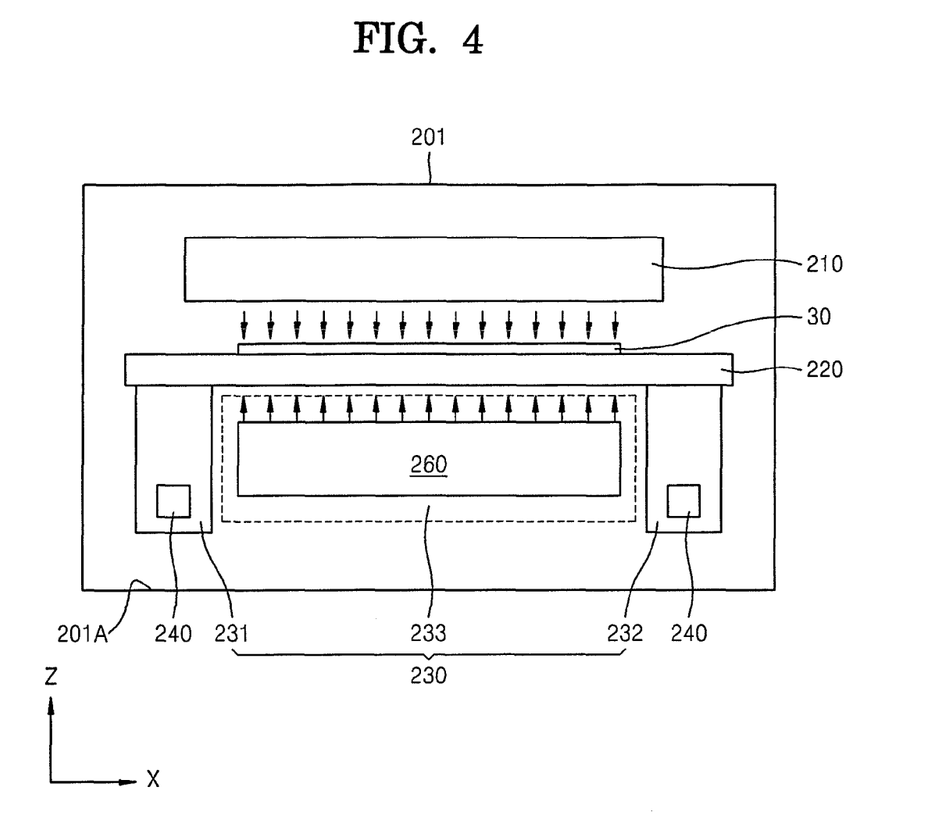
FIG. 4 is a lateral view of the vapor deposition apparatus of FIG. 3.
Figure 5:
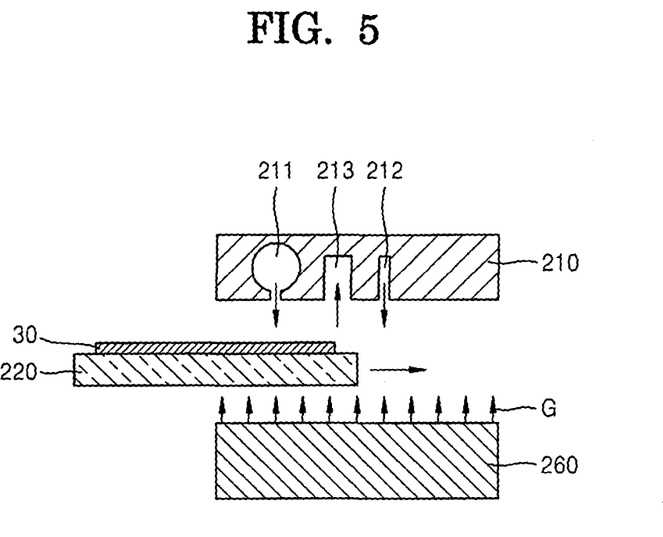
FIG. 5 is a cross-sectional view taken along a line V-V of FIG. 3.

FIG. 3 is a schematic perspective view of a vapor deposition apparatus 200 according to another embodiment. FIG. 4 is a lateral view of the vapor deposition apparatus 200 of FIG. 3. FIG. 5 is a cross-sectional view taken along a line V-V of FIG. 3.

In the example embodiment shown in FIGS. 3 through 5, the vapor deposition apparatus 200 includes a chamber 201, a supply unit 210, a blocking gas flow generation unit 260, a driving unit 230, and a stage 220.

The chamber 201 may be connected to a pump (not shown) to control an ambient or atmospheric pressure during a deposition process, and may accommodate the substrate 30, the supply unit 210, the blocking gas flow generation unit 260, and other members, so as to protect them. Although not shown, the chamber 201 may include at least one doorway through which the substrate 30 may move in and out.

The supply unit 210 supplies at least one gas towards the substrate 30 to perform a deposition process with respect to the substrate 30. The supply unit 210 may be of various types, for example, as depicted in FIG. 5, the supply unit 210 may include a first injection unit 211, a second injection unit 212, and an exhaust unit 213. The first injection unit 211 may inject a first raw material, and the second injection unit 212 may inject a second raw material.

An example deposition process that uses the supply unit 210 will now be briefly described. A first layer that contains the first raw material gas injected from the first injection unit 211 is formed by moving the substrate 30 to a position corresponding to the first injection unit 211, and a second layer that contains the second raw material injected from the second injection unit 212 is formed on the first layer by moving the substrate 30 to a position corresponding to the second injection unit 212 to react with the first layer, and as a result, a layer that contains the first raw material gas and the second raw material is formed on the substrate 30. At this point, residual by-product gases and surplus gases are exhausted through the exhaust unit 213. Also, although not shown, the first injection unit 211 may inject the first raw material gas in a radical type form by generating plasma when the first raw material gas is injected.

The substrate 30 may be disposed to be able to reciprocally move in directions indicated by the arrows, that is, M1 and M2 directions of FIG. 3.

The substrate 30 is placed on the stage 220. A fixing member (not shown) such as a clamp (not shown) may further be included to stably place the substrate 30 on the stage 220.

The substrate 30 may be disposed below the supply unit 210, and thus, the supply unit 210 may inject at least one gas towards the substrate 30, that is, towards the ground.

The driving unit 230 is disposed to be able to be connected to the stage 220 below the stage 220. The substrate 30 that is placed on the stage 220 moves through the driving unit 230. Thus, the driving unit 230 may move in the directions M1 and M2 of FIG. 3, and as a result, the substrate 30 may have a reciprocal movement.

The driving unit 230 moves along guide rails 240, and thus, a horizontal state of the driving unit 230 may be readily maintained, and also, vibration and shaking of the driving unit 230 may be prevented. As a result, the substrate 30 may have a uniform reciprocal movement during a deposition process and a uniform characteristic of the deposited film may be provided.

The driving unit 230 may include a first supporting member 231, a second supporting member 232, and a separation space 233.

The first supporting member 231 and the second supporting member 232 are disposed to move along the guide rails 240 as they are separated from each other, and are connected to the stage 220.

The separation space 233 is defined as a space between the first supporting member 231 and the second supporting member 232. Also, the separation space 233 is separated from the guide rails 240.

The blocking gas flow generation unit 260 is disposed to correspond to the supply unit 210 to be able to inject the blocking gas G upwards. The blocking gas flow generation unit 260 includes a plurality of slits to inject the blocking gas G, and as described above, the slits may have shape such as, e.g., a circular shape or a linear shape.

The blocking gas flow generation unit 260 is disposed to correspond to the supply unit 210, and thus, injects the blocking gas G in a counter direction to the raw material gas injected from the supply unit 210. The blocking gas G may include an inert gas that does not react with a raw material gas so as to prevent an effect to the deposition process.

Also, the blocking gas flow generation unit 260 may prevent the raw material gas from spreading by injecting the blocking gas G towards the supply unit 210. In particular, the blocking gas G may prevent a bottom surface 201A of the chamber 201 from being contaminated by the raw material gas injected from the supply unit 210.

In the vapor deposition apparatus 200 according to the current embodiment, the efficiency of the deposition process may be increased since the deposition process is performed by a continuous movement of the substrate 30. Thus, the substrate 30 may be disposed on the stage 220, and the stage 220 may be reciprocally moved by the driving unit 230. At this point, since the driving unit 230 is guided by the guide rail 240, the driving unit 230 may be able to reciprocally move while maintaining a horizontal state and may precisely control the reciprocal movement of the substrate 30.

The driving unit 230 includes the first supporting member 231, the second supporting member 232, and the separation space 233. The blocking gas flow generation unit 260 is disposed between the guide rails 240 to be separated from the guide rails 240, and corresponds to the separation space 233 of the driving unit 230 when the driving unit 230 is moved. In this manner, if the substrate 30 is outside of a region corresponding to the supply unit 210, the contamination of an inner wall of the chamber 201, in particular, the bottom surface 201A of the chamber 201, by the raw material gas injected from the supply unit 210 may be reduced or prevented.

Also, as described above, the first injection unit 211 of the supply unit 210 may generate plasma when the first raw material gas is injected. The movement of the substrate 30 may lead to a pressure change at a periphery of the first injection unit 211 such that a state of the plasma may be rapidly changed, and thus, the deposition characteristics may be affected. In the current embodiment, by injecting the blocking gas G from the blocking gas flow generation unit 260 towards the supply unit 210, reduction of the deposition characteristic may be avoided by preventing a rapid change in atmospheric pressure at a periphery of the supply unit 210, in particular, below the supply unit 210, even when the substrate 30 is located outside of the region of the supply unit 210.

Figure 6:
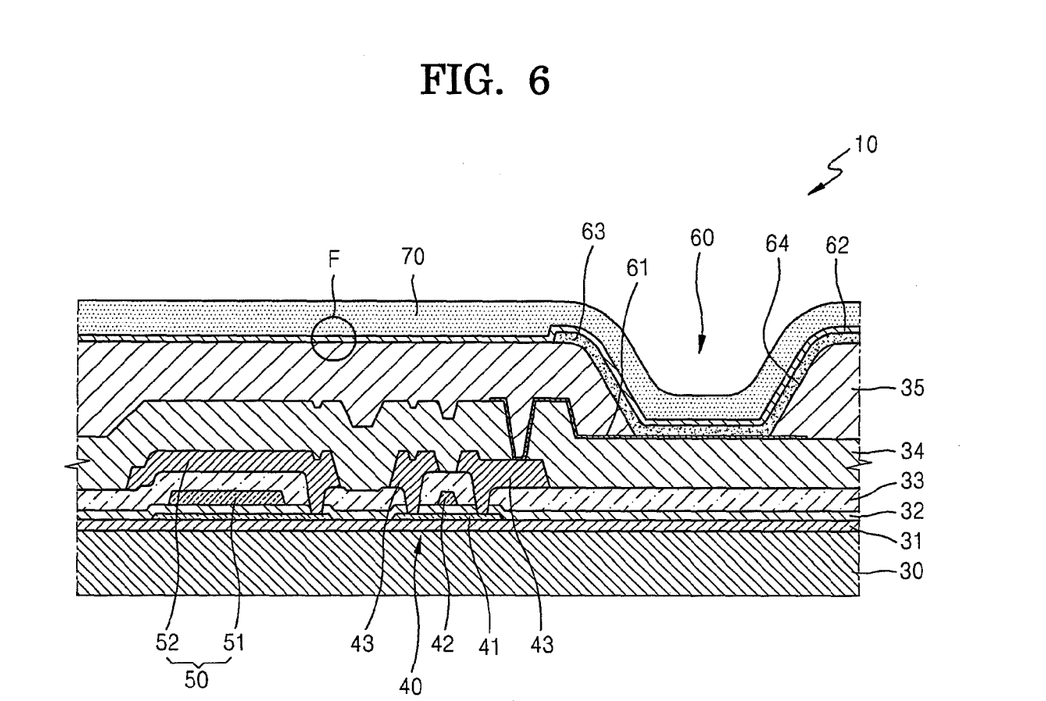
FIG. 6 is a schematic cross-sectional view of an organic light-emitting display apparatus manufactured using the vapor deposition apparatus according to an embodiment.
Figure 7:
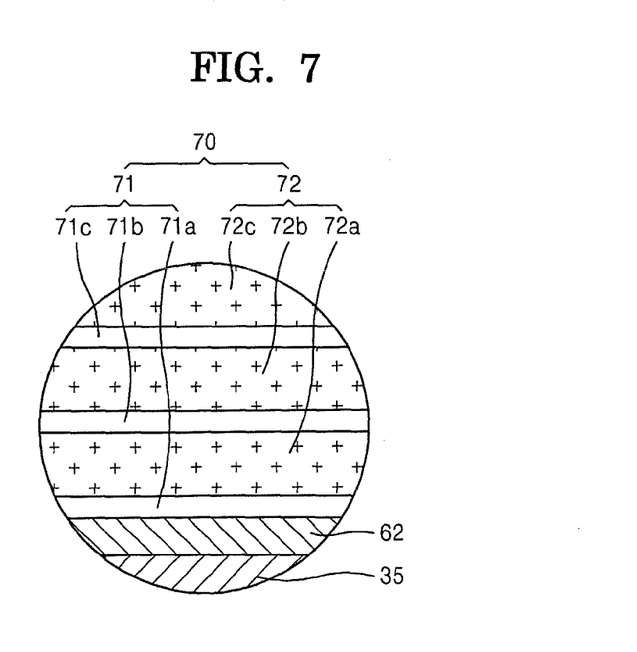
FIG. 7 is a magnified view of a portion F of FIG. 6.

FIG. 6 is a schematic cross-sectional view of an organic light-emitting display apparatus 10 manufactured using the vapor deposition apparatus according to an embodiment. FIG. 7 is a magnified view of a portion F of FIG. 6.

More specifically, FIGS. 6 and 7 show the organic light-emitting display apparatus 10 manufactured by using the vapor deposition apparatuses 100 and 200 described above.

The organic light-emitting display apparatus 10 is formed on the substrate 30. The substrate 30 may be formed of e.g., a glass material, a plastic material, or a metal.

A buffer layer 31 is formed on the substrate 30 to provide a planarized surface and to prevent moisture and foreign materials from penetrating towards the substrate 30.

A thin film transistor (TFT) 40, a capacitor 50, and an organic light-emitting device 60 are formed on the buffer layer 31. The TFT 40 includes an active layer 41, a gate electrode 42, and source/drain electrodes 43. The organic light-emitting device 60 includes a first electrode 61, a second electrode 62, and an intermediate layer 63. The capacitor 50 includes a first capacitor electrode 51 and a second capacitor electrode 52.

The active layer 41, formed to a predetermined pattern, may be disposed on an upper surface of the buffer layer 31. The active layer 41 may include an inorganic semiconductor material such as silicon, an organic semiconductor material, or an oxide semiconductor material, and may be formed by doping a p-type dopant or an n-type dopant.

A gate insulating film 32 is formed on the active layer 41. The gate electrode 42 is formed on the gate insulating film 32 to correspond to the active layer 41. The first capacitor electrode 51 may be formed on the gate insulating film 32 by using the same material used to form the gate electrode 42.

An interlayer insulating layer 33 covering the gate electrode 42 is formed, and the source/drain electrodes 43 are formed to contact predetermined regions of the active layer 41 on the interlayer insulating layer 33. The second capacitor electrode 52 may be formed on the interlayer insulating layer 33 by using the same material used to form the source/drain electrodes 43.

A passivation layer 34 covering the source/drain electrodes 43 is formed, and an additional insulating layer may be further formed on the passivation layer 34 to planarize the TFT 40.

The first electrode 61 is formed on the passivation layer 34. The first electrode 61 is formed to be electrically connected to one of the source/drain electrodes 43. Afterwards, a pixel defining film 35 covering the first electrode 61 is formed. After forming a predetermined opening 64 in the pixel defining film 35, an intermediate layer 63 that includes an organic light-emitting layer is formed in a region defined by the opening 64. The second electrode 62 is formed on the intermediate layer 63.

An encapsulating layer 70 is formed on the second electrode 62. The encapsulating layer 70 may contain an organic material or an inorganic material, and may have a structure in which the organic material and the inorganic material are alternately stacked.

The encapsulating layer 70 may be formed by using the vapor deposition apparatuses 100 and 200 according to embodiments. Thus, a desired layer may be formed by using the vapor deposition apparatuses 100 and 200 by moving the substrate 30 on which the second electrode 62 is formed in a chamber.

In particular, the encapsulating layer 70 includes an inorganic layer 71 and an organic layer 72, and the inorganic layer 71 includes a plurality of layers 71a, 71b, and 71c, and the organic layer 72 includes a plurality of layers 72a, 72b, and 72c. At this point, the layers 71a, 71b, and 71c of the inorganic layer 71 may be formed by using the vapor deposition apparatuses 100 and 200.

In other implementations, the buffer layer 31, the gate insulating film 32, the interlayer insulating layer 33, the passivation layer 34, the pixel defining film 35, and/or other insulating layers may be formed by using the vapor deposition apparatuses 100 and 200 according to embodiments.

Also, the active layer 41, the gate electrode 42, the source/drain electrodes 43, the first electrode 61, the intermediate layer 63, the second electrode 62, and other various thin films may be formed by using the vapor deposition apparatuses 100 and 200 according to embodiments.

As described above, when the vapor deposition apparatuses 100 and 200 according to embodiments are used, the characteristics of deposited films formed in the organic light-emitting display apparatus 10 may be increased, and thus, the electrical characteristics and image quality characteristics may be increased.

Also, thin films included in liquid crystal display (LCD) apparatuses and thin films included in various display apparatuses besides the organic light-emitting display apparatus 10 may be formed by using the vapor deposition apparatuses 100 and 200 according to embodiments.

By way of summation and review, a vapor deposition method may be used to form a thin film in a device. The vapor deposition method uses one or more gases as raw materials to form a thin film. The vapor deposition method includes a chemical vapor deposition (CVD) method, an atomic layer deposition (ALD) method, and the like.

According to the ALD method, after a raw material is injected and purged/pumped, a single layer or a composite layer is adsorbed to a substrate, and then another raw material is injected and purged/pumped, so that a desired single or composite atomic layer is formed. Among display apparatuses, an organic light-emitting display apparatus is expected to become a next generation display apparatus due to its wide viewing angles, high contrast, and fast response speeds. The organic light-emitting display apparatus includes an intermediate layer having an organic emission layer between first and second electrodes which face each other, and also includes one or more various thin films. A deposition process may be used to form a thin film of the organic light-emitting display apparatus. As the organic light-emitting display apparatus is increased in size and is configured to have high definition, it may become difficult to deposit a large thin film with a desired characteristic. Also, there may be a limit in increasing an efficiency of a process of forming the large thin film.

As described above, embodiments relate to a vapor deposition apparatus with which a deposition procedure may be efficiently performed and a characteristic of a deposition film may be improved. Embodiments also relate to a method of forming a thin film using the vapor deposition apparatus, and a method of manufacturing an organic light-emitting display apparatus. Embodiments may provide a vapor deposition apparatus that may be used to efficiently perform a deposition process and to improve a characteristic of a deposition film, a method of manufacturing a thin film using the vapor deposition apparatus, and a method of manufacturing an organic light-emitting display apparatus.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of forming a thin film on a substrate using a vapor deposition apparatus, the method comprising:
   performing a deposition process on the substrate, the deposition process including injecting at least one raw material gas towards the substrate while moving the substrate on a stage relative to a supply unit that injects the at least one raw material gas; and
   blocking a flow of the raw material gas using a gas flow generated by a blocking gas flow generation unit that is disposed corresponding to the supply unit such that the blocking gas flow generation unit injects a blocking gas in a direction counter to an injection direction of the raw material gas from the supply unit such that the flow of the raw material gas in the injection direction of the raw material gas is blocked to prevent the raw material gas from contaminating a bottom surface of the vapor deposition apparatus opposite the supply unit in the injection direction of the raw material gas from the supply unit.

2. The method of claim 1, wherein the blocking gas contains an inert gas, the blocking gas flow generation unit injects the blocking gas towards the supply unit when the substrate is not located in a region corresponding to the supply unit, and the blocking gas flow generation unit is disposed directly below the supply unit when the substrate is not located in a region corresponding to the supply unit.

3. The method of claim 1, wherein the deposition process forms a conductive film.

4. The method of claim 1, wherein moving the substrate includes moving the substrate in a direction orthogonal to a direction in which the blocking gas flow generation unit injects the blocking gas and orthogonal to the injection direction of the raw material gas from the supply unit.

5. A method of manufacturing an organic light-emitting display apparatus that includes a thin film formed on a substrate, the method comprising:
   performing a deposition process on the substrate using a vapor deposition apparatus, the deposition process including injecting at least one raw material gas towards the substrate while moving the substrate on a stage relative to a supply unit that injects the at least one raw material gas; and
   blocking a flow of the raw material gas using a gas flow generated by a blocking gas flow generation unit that is disposed corresponding to the supply unit such that the blocking gas flow generation unit injects a blocking gas in a direction counter to an injection direction of the raw material gas from the supply unit such that the flow of the raw material gas in the injection direction of the raw material gas is blocked to prevent the raw material gas from contaminating a bottom surface of the vapor deposition apparatus opposite the supply unit in the injection direction of the raw material gas from the supply unit.

6. The method of claim 5, wherein the organic light-emitting display apparatus includes a first electrode, an intermediate layer that includes an organic light-emitting layer, a second electrode, and an encapsulating layer, and
   the deposition process forms the encapsulating layer.

7. The method of claim 5, wherein the deposition process forms an insulating layer.

* * * * *